US011249129B2

United States Patent
Zhang et al.

(10) Patent No.: US 11,249,129 B2
(45) Date of Patent: Feb. 15, 2022

(54) IGBT-MODULE CONDITION MONITORING EQUIPMENT AND METHOD

(71) Applicants: Tsinghua University, Beijing (CN); Envision Energy (Jiangsu) Co., Ltd., Jiangyin (CN)

(72) Inventors: Pinjia Zhang, Beijing (CN); Yanyong Yang, Beijing (CN); Zheng Wang, Beijing (CN); Hongdong Zhu, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 67 days.

(21) Appl. No.: 16/850,770

(22) Filed: Apr. 16, 2020

(65) Prior Publication Data
US 2021/0063466 A1 Mar. 4, 2021

(30) Foreign Application Priority Data
Sep. 3, 2019 (CN) .......................... 201910825141.X (51) Int. Cl.
*G01R 31/26* (2020.01)
*H01L 21/66* (2006.01)
*H01L 29/739* (2006.01)

(52) U.S. Cl.
CPC .......... *G01R 31/2608* (2013.01); *H01L 22/30* (2013.01); *H01L 29/7393* (2013.01)

(58) Field of Classification Search
CPC ................ G01R 31/26; G01R 31/2608; G01R 31/2621; G01R 15/12; G01R 15/14; G01R 19/00; G01R 19/0084; G01R 19/0069; G01R 31/2601; G01R 31/70; G01R 31/71; H01L 22/30; H01L 29/7393
See application file for complete search history.

(56) References Cited

U.S. PATENT DOCUMENTS

2015/0002183 A1* 1/2015 Bode .................. G01R 31/2896
324/762.02

FOREIGN PATENT DOCUMENTS

JP 2003075314 * 3/2001 ............... G01N 3/32

* cited by examiner

*Primary Examiner* — Son T Le
(74) *Attorney, Agent, or Firm* — Dragon Sun Law Firm, PC; Jinggao Li, Esq.

(57) ABSTRACT

Disclosed are an IGBT-module condition monitoring equipment and method. The IGBT-module condition monitoring equipment includes an IGBT module, a gate turning-on voltage overshoot monitoring module, a driving circuit, a bond wire state judging module, and a signal acquisition module. The breakage condition of bond wires is obtained by comparing a monitored actual gate turning-on voltage overshoot with a preset reference gate turning-on voltage overshoot threshold. The present invention solves the problem encountered in monitoring the aging of IGBT bond wires in power electronic converters. By characterizing the bond wire detachment with the gate turning-on voltage overshoot, the slight aging of the detached bond wires can be monitored without disturbing the operation, which is high in resolution and free of invasiveness and enables real-time online monitoring at high sampling rate and low cost, showing great significance in the monitoring of the IGBT and the reliability evaluation of power electronic converters.

14 Claims, 5 Drawing Sheets

IGBT-MODULE CONDITION MONITORING EQUIPMENT AND METHOD

CROSS-REFERENCE TO RELATED PATENT APPLICATION

This application claims priority to and the benefit of CN201910825141.X, filed Sep. 3, 2019 entitled "IGBT-MODULE CONDITION MONITORING EQUIPMENT AND METHOD," by Pinjia Zhang et al. The entire disclosure of the above-identified application is incorporated herein by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

TECHNICAL FIELD

The present invention belongs to the field of electrical engineering, and relates to a power electronic converter condition monitoring solution, and more particularly, to an IGBT-module condition monitoring equipment and method.

BACKGROUND OF THE INVENTION

Power electronic devices are key components of power electronic converters, and are also the most vulnerable converter components that are prone to failures. The failure rate of the power electronic devices is 31%, which can be the highest among all types of failures. As the most widely used power electronic devices, IGBT (Insulated Gate Bipolar Transistor) accounts for the largest proportion among all types of power electronic devices. In order to prevent heavy losses caused by catastrophic failures of the power electronic converters, it is of great significance to carry out online reliability monitoring for the power electronic devices.

Bond wire failures are the most prominent and common causes of failures for wire-bonding packaged devices. The interior of the IGBT keeps a high-speed switching operation state for a long time, suffering frequent fluctuations of thermal and electromagnetic stresses. These fluctuations of stresses lead to fatigue and aging of the devices. Lift-off and fracture of bond wires are the prominent types of failures for the wire-bonding packaged devices.

Scholars at home and abroad have performed a lot of researches on the bond wire monitoring of IGBT modules, and proposed methods that mainly include: a method based on the short-circuit current, a method based on the turning-on voltage drop, and a method based on the gate signals.

The bond wire monitoring method based on short-circuit current has high resolution, but it requires complicated gate driving circuit. Besides, constant switching of the driving voltage increases the complexity of driving, and regular short-circuit monitoring interferes with the normal operation of the converters. The method based on on-state voltage drop can identify the lift-off of the bond wires. However, it has low resolution when the bond wire failure is slight. Moreover, it is difficult to measure the on-state voltage drops accurately in operation. The method based on the gate turning-on voltage and current has been studied for bond wire identification, but it is difficult to make a quantitative description. There is a significant difference only when a very severe bond wire failure occurs. The method based on gate Miller platform time can evaluate the aging of the IGBT, but it requires a large driving resistance. However, the large driving resistance makes it difficult to increase the switching frequency of IGBT.

Therefore, a heretofore unaddressed need exists in the art to address the aforementioned deficiencies and inadequacies.

SUMMARY OF THE INVENTION

An object of the present invention is to propose an IGBT-module condition monitoring equipment and method to address the problems in the prior art. According to the IGBT-module condition monitoring method, gate voltage signals that are convenient to measure are sampled, which is free of invasiveness. The failure of slight bond wire failure can be identified in time. The proposed method has high resolution and is effective for early warning of IGBT failures. The present invention has a high application value in the online condition monitoring of IGBT module.

The present invention is implemented by the following technical solutions.

According to the first aspect of the present invention, there is provided an IGBT-module condition monitoring equipment, including: an IGBT module, a gate turn on voltage overshoot monitoring module, a driving circuit, a bond wire state judging module, and a signal acquisition module, wherein the gate turns on voltage overshoot monitoring module includes a voltage sampling circuit for measuring a voltage between the gate and the emitter of IGBT module to monitor an actual gate turn on voltage overshoot;

the driving circuit includes a driving power source and a driving resistor which is connected to the gate and the emitter of the IGBT module;

the bond wire state judging module estimates a bonding-wire condition by judging a magnitude relationship between the actual gate turning-on voltage overshoot and a reference gate turning-on voltage overshoot threshold $V_{g\_p}$; and the signal acquisition module transmits an acquired signal to the bond wire state judging module for determining the reference gate turn on voltage overshoot threshold $V_{g\_p}$.

Further, the bond wire state judging module includes a comparator and a processor;

the comparator is configured to judge the magnitude relationship between the actual gate turning-on voltage overshoot and the reference gate turning-on voltage overshoot threshold $V_{g\_p}$ and send a judging result to the processor; and the processor performs an early warning on the bond wire state according to the judging result.

Further, a plurality of the comparators is provided, and the reference gate turning-on voltage overshoot threshold $V_{g\_p}$ of each of the comparators corresponds to a corresponding number of broken bond wires; and the IGBT-module condition monitoring equipment further includes latches, which are connected to outputs of the comparators and configured to perform comparison state locking on a gate turning-on voltage overshoot value.

Further, the IGBT-module condition monitoring equipment includes counters, wherein inputs of the counters are connected to outputs of the latches, and outputs of the counters are connected to the processor; and the counters are configured to record reversing numbers of different comparators for judging a probability of occurrence that a corresponding number of lift-off bond wires.

Further, in case of operating at the same bus voltage, collector-emitter current and temperature, the reference gate turning-on voltage overshoot threshold $V_{g\_p}$ is calculated by means of a formula as follows:

$$V_{g\_p} = V_{g\_mil} + \left(\frac{L_{p\_A}}{n-m} + L_{s\_e} + L_g\right)\frac{di_c}{dt} \quad (1)$$

wherein $V_{g\_mil}$ is a gate Miller voltage, $L_{p\_A}$ is parasitic inductance of each bond wire which is between an emitter of an IGBT chip and a copper busbar in the IGBT module, n is a number of the bond wires, m is a number of broken or lift-off bond wires, $L_{s\_e}$ is equivalent parasitic inductance of the bond wires between the emitter of the IGBT and a cathode of the driving power source, $L_g$ is the sum parasitic inductance of the internal gate bond wire and driving resistor, and $i_c$ is the collector current.

Further, among them, $V_{g\_mil}$ and $$\frac{di_c}{dt}$$

are related to the bus voltage, the collector-emitter current and the temperature; in case of different bus voltages, collector-emitter currents and temperatures, the gate turning-on voltage overshoot is tested in a preliminary test, and then a relationship among $V_{g\_mil}$ $$\frac{di_c}{dt},$$

as well as the bus voltage, collector-emitter current, and temperature is given by multi-point fitting or by building a data table; and then with the formula 1 above, the reference gate turning-on voltage overshoot thresholds $V_{g\_p}$ corresponding to different number of broken bond wires in operating states at different bus voltages, collector-emitter currents and temperatures are calculated.

According to the second aspect of the present invention, there is provided an IGBT-module condition monitoring method, including the following steps:

driving an IGBT module to be monitored by a driving power source through a driving resistor;

measuring a voltage between a gate and an emitter of an IGBT in the IGBT module in real time to monitor an actual gate turning-on voltage overshoot;

comparing the actual gate turning-on voltage overshoot with a reference gate turning-on voltage overshoot threshold to obtain a comparison result; and judging a bond wire state on the basis of the comparison result.

Further, the IGBT-module condition monitoring method further includes a step of setting the reference gate turning-on voltage overshoot threshold in advance, and the step includes:

testing the gate turning-on voltage overshoot in a preliminary test with different bus voltages, collector currents and temperatures;

giving a relationship among $V_{g\_mil}$, $$\frac{di_c}{dt},$$

as well as the bus voltage, collector-emitter current, and temperature by multi-point fitting or by building a data table; and calculating the reference gate turning-on voltage overshoot thresholds $V_{g\_p}$ corresponding to different number of broken bond wires in operating states at different bus voltages, collector-emitter currents and temperatures, with a formula 1 below:

$$V_{g\_p} = V_{g\_mil} + \left(\frac{L_{p\_A}}{n-m} + L_{s\_e} + L_g\right)\frac{di_c}{dt} \quad (1)$$

wherein $V_{g\_mil}$ is a gate Miller voltage, $L_{p\_A}$ is parasitic inductance of each bond wire which is between an emitter of an IGBT chip and a copper busbar in the IGBT module, n is a number of the bond wires, m is a number of broken or lift-off bond wires, $L_{s\_e}$ is equivalent parasitic inductance of the bond wires between the emitter of the IGBT and a cathode of the driving power source, $L_g$ is the sum parasitic inductance of the internal gate bond wire and driving resistor, and $i_c$ is the collector current.

Further, the step of comparing the actual gate turning-on voltage overshoot with the reference gate turning-on voltage overshoot threshold to obtain the comparison result includes:

setting the reference gate turning-on voltage overshoot thresholds corresponding to the different numbers m of broken bond wires;

setting n comparators, wherein n is the number of the bond wires, and the m-th comparator corresponds to the reference gate turning-on voltage overshoot threshold of the m broken bond wires, with m∈n; and judging a magnitude relationship between the actual gate turning-on voltage overshoot and the reference gate turning-on voltage overshoot threshold, and reversing output levels of the first to the m-th comparators if the actual gate turning-on voltage overshoot is greater than the m-th reference gate turning-on voltage overshoot threshold.

Further, the IGBT-module condition monitoring method further includes: setting n latches corresponding to the n comparators for latching reversing of the corresponding comparators;

connecting a driving signal of the driving power source to reset terminals of the latches, so that output signal periods of the latches are consistent with IGBT switching periods.

Further, the step of judging the bond wire state according to the comparison result includes:

setting n counters corresponding to the n latches for recording reversing number of the corresponding comparators; and when the reversing number of the corresponding comparator exceeds a threshold, judging that the bond wires with the number corresponding to the comparator break.

In summary, the present invention provides an IGBT-module condition monitoring equipment and method. The IGBT-module condition monitoring equipment includes an IGBT module, a gate turning-on voltage overshoot monitoring module, a driving circuit, and a bond wire state judging module. The breakage condition of bond wires is obtained by comparing a monitored actual gate turning-on voltage overshoot with a preset reference gate turning-on voltage overshoot threshold. The present invention solves the problem encountered in monitoring the aging of IGBT bond wires in power electronic converters. By characterizing the bond wire fracture with the gate turning-on voltage overshoot, the slight aging of the detached bond wires can be monitored without disturbing the operation, which is high in resolution and free of invasiveness and enables real-time online monitoring at high sampling rate and low cost, showing great significance in the monitoring of the IGBT and the reliability evaluation of power electronic converters.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

DETAILED DESCRIPTION OF THE INVENTION

To make the object, technical solutions, and advantages of the present invention clearer, the following further explains the present invention in detail in conjunction with specific embodiments and with reference to the accompanying drawings. It should be understood that the following description is merely exemplary and is in no way intended as a limitation to the scope of the present invention. In addition, the description of well-known structures and techniques is omitted in the illustration below so as to avoid unnecessarily obscuring the concept of the present invention.

Figure 1:
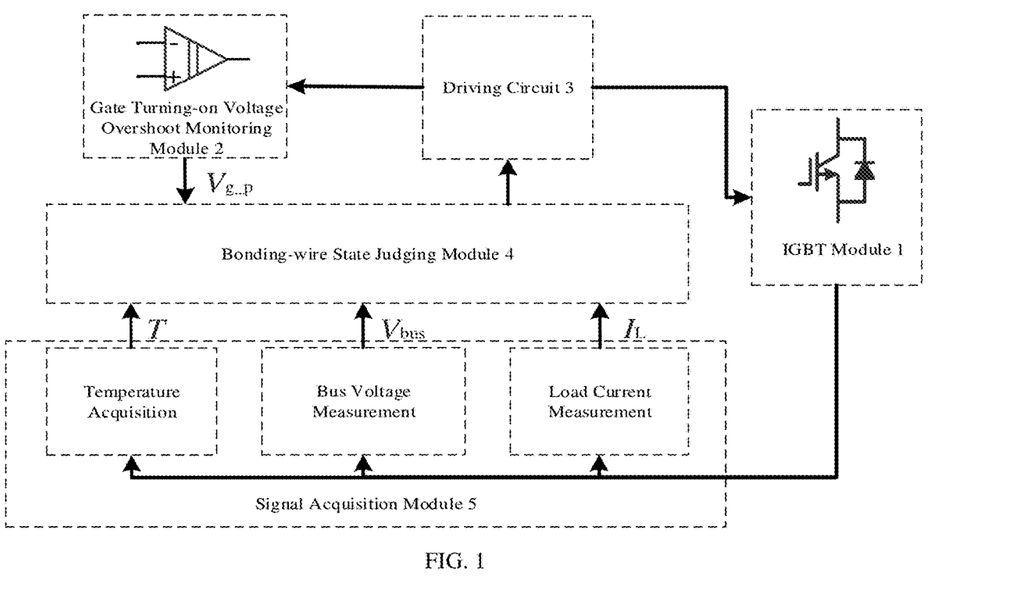
FIG. 1 is a schematic structural diagram of an IGBT-module condition monitoring equipment according to the present invention.

According to the first aspect of the present invention, there is provided an IGBT module condition monitoring equipment. As shown in FIG. 1, the equipment includes: an IGBT module 1, a gate turning-on voltage overshoot monitoring module 2, a driving circuit 3, a bond wire state judgment module 4 and a signal acquisition module 5. The gate turning-on voltage overshoot monitoring module 4 includes a voltage sampling circuit for measuring the voltage between the gate and the emitter of an IGBT in the IGBT module 1 to monitor the actual gate turning-on voltage overshoot; the driving circuit 3 includes a driving power source and a driving resistor, and the driving power source is connected to the gate and the emitter of the IGBT module 1 through the driving resistor; the bond wire state judging module 4 judges a bond wire state by judging a magnitude relationship between the actual gate turning-on voltage overshoot and a reference gate turning-on voltage overshoot threshold $V_{g\_p}$; and the signal acquisition module transmits an acquired signal to the bond wire state judgment module for setting the reference gate turning-on voltage overshoot threshold $V_{g\_p}$ to specifically acquire information such as bus voltage, load current, and temperature.

Figure 2:
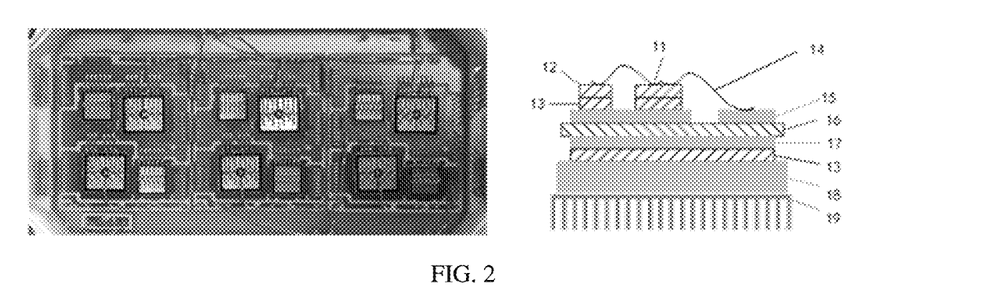
FIG. 2 shows a bond wire structure inside a typical IGBT in the prior art.

Specifically, the IGBT module 1 is a typical large-capacity wire-bonded IGBT module, which has an internal structure as shown in FIG. 2, and generally includes an IGBT chip 11, a diode 12, a solder layer 13, an aluminum bond wire 14, an upper copper layer 15 on a copper substrate, a ceramic layer 16, a lower copper layer 17 on the copper substrate, a substrate 18, and a heat sink 19. The module consists of multiple IGBT chips connected in parallel. The connections among all the chips and between the chips and connection terminals are typically implemented depending on bond wires, copper plates and busbars. To ensure the temperature stability and safety inside the module, and improve the insulation performance of an electrical part and prevent cosmic-ray radiation, the chips are filled with transparent silicone grease with extremely low thermal conductivity coefficient, at the top. Generally, the power loss of the IGBT module is basically dissipated by the lower copper layer on the copper substrate through the heat sink.

Figure 3:
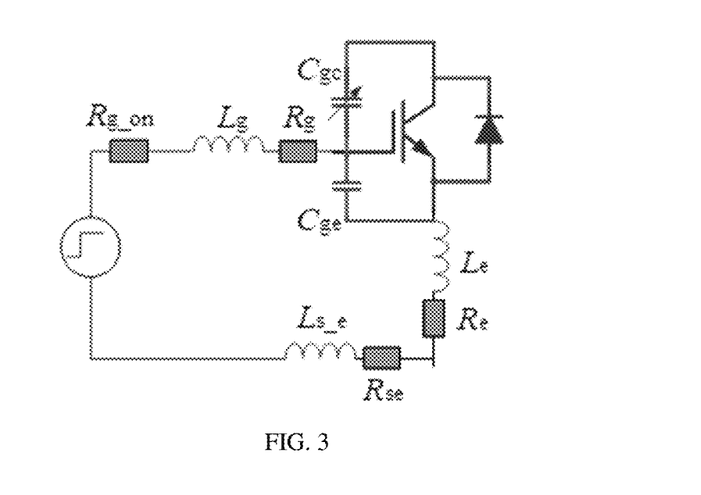
FIG. 3 is an equivalent circuit diagram of distributed driving in consideration of bond wires inside an IGBT.

FIG. 3 is an equivalent circuit of distributed driving in consideration of the bond wires inside the IGBT. In this circuit, parasitic capacitance of the IGBT and parasitic resistance and parasitic inductance of the bond wires are considered. Among them, $R_{g\_on}$ is the driving resistance; the driving power source is connected to a gate of the IGBT internal chip via the $R_{g\_on}$ and one bond wire; and the bond wire contains parasitic inductance $L_g$ and parasitic resistance $R_g$. The collector and emitter include n bond wires, and the n bond wires contain parasitic inductance $L_e$ and parasitic resistance $R_e$. A driving loop returns to a cathode of the driving power source via one bond wire of an auxiliary emitter, and the bond wire of the auxiliary emitter includes parasitic inductance $L_{s\_e}$ and parasitic resistance $R_{s\_e}$. Meanwhile, the capacitance between the gate and the emitter of the IGBT is $C_{ge}$, and the capacitance between the gate and the collector is $C_{ge}$.

Figure 4:
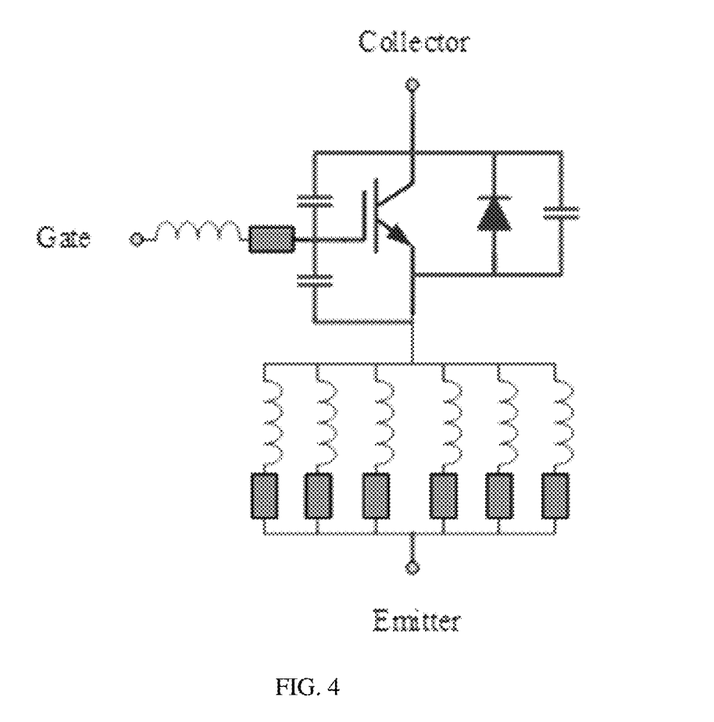
FIG. 4 is an equivalent circuit diagram in consideration of multiple bond wires and parasitic capacitance inside an IGBT.

FIG. 4 shows an equivalent circuit in consideration of multiple bond wires and parasitic capacitance inside an IGBT. $L_{p\_A}$ is the parasitic inductance of each bond wire, and can be expressed as:

$$L_{P\_A} = 2 \cdot 10^{-1} \cdot l \cdot \left[ \ln\left(4 \cdot 10^3 \cdot \frac{l}{d}\right) - 0.75 \right] \quad (1)$$

In the formula, l indicates the length of the bond wire, and d indicates the diameter of the bond wire. Then, in a circuit containing n healthy bond wires connected in parallel, the equivalent parasitic inductance thereof is expressed as:

$$L_e = \frac{L_{p\_A}}{n}, \quad (2)$$

wherein $V_{bus}$ is a DC bus voltage, and $I_L$ is a current which flows through a load and will flow through the collector and emitter of the IGBT after the IGBT is fully turned on.

Figure 5:
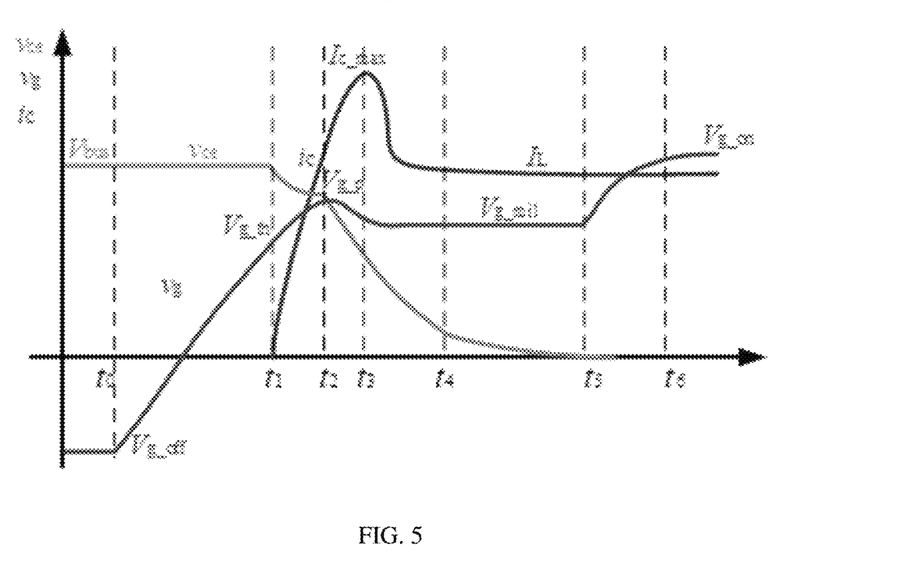
FIG. 5 is a schematic diagram of key waveforms of an IGBT turning-on process.

FIG. 5 is a schematic diagram of key waveforms (including a collector-emitter voltage $v_{ce}$, a collector current $i_c$, and a gate voltage $v_g$) when the IGBT is turned on. In FIG. 5, all the physical quantities are expressed as follows: gate current $i_g$, gate driving voltage $v_g$, collector-emitter voltage $v_{ce}$, collector current $i_c$, gate threshold voltage $V_{g\_th}$, load current $I_L$, gate Miller voltage $V_{g\_mil}$, gate turning-on voltage overshoot $V_{g\_p}$, gate turning-on voltage $V_{g\_on}$, gate turning-off voltage $V_{g\_off}$, DC bus voltage $V_{bus}$, collector turning-on current overshoot $V_{c\_max}$. In addition, the gate driving resistance is expressed as $R_{g\_on}$, and the gate input capacitance is expressed as $C_{ies}$. According to different waveform characteristics, there are 6 phases divided.

Phase 1 $[t_0$-$t_1]$: at this phase, the driving power source charges input capacitance $C_{ies}$ through the driving resistance $R_{g\_on}$, with a charging current expressed as $i_g$. Here, the gate voltage $v_g$ rises exponentially, which makes the concentration of electrons at the gate of the IGBT increase gradually. During this period, the collector-emitter voltage $v_{ce}$ and the collector current $i_c$ remain unchanged, the collector-emitter voltage $v_{ce}$ is the DC bus voltage $V_{bus}$, and the collector current $i_c$ is zero.

Phase 2 $[t_1$-$t_2]$: this phase starts from the moment $t_1$, at which the gate voltage increases to the gate threshold voltage $V_{g\_th}$. The gate begins to show a strong inversion layer. A gate channel begins to conduct, and the collector current $i_c$ rapidly increases from 0 to the load current $I_L$. Here, the collector-emitter voltage $v_{ce}$ drops slightly due to the presence of the parasitic inductance of the bus.

Phase 3 $[t_2$-$t_3]$: at the beginning of this phase, the collector current $i_c$ has risen to $I_L$. Here, the voltage of an anti-parallel diode of an upper tube starts to rise, and the collector-emitter voltage $v_{ce}$ starts to decrease rapidly. At this phase, the Miller capacitance equivalent to the input capacitance is very large, so that all the gate currents $i_g$ charge the input Miller capacitance, and the voltage of the gate capacitance $C_{gc}$ remains unchanged as a constant gate Miller voltage $V_{g\_mil}$. However, the anti-parallel diode of the upper tube undergoes reverse recovery at a turning-off time. Therefore, the collector current $i_c$ will continue to rise after rising to the load current $I_L$. On a lead inductor, the rising current may form a very high induced voltage, which is superimposed on the gate Miller voltage $V_{g\_mil}$ to form the gate turning-on voltage overshoot $V_{g\_p}$. This voltage overshoot is closely related to the value of the parasitic inductance of the bond wire, so that the health state of the bond wire can be monitored by using the gate turning-on voltage overshoot. When the m bond wires are broken, if the parasitic resistance of the bond wire and the voltage drop across the driving circuit are ignored, the gate turning-on voltage overshoot $V_{g\_p}$ is expressed as follows (in case of operating at the same bus voltage, collector-emitter current, and temperature):

$$V_{g\_p} = V_{g\_mil} + (L_e + L_{s\_e} + L_g)\frac{di_c}{dt} = V_{g\_mil} + \left(\frac{L_{p\_A}}{n-m} + L_{s\_e} + L_g\right)\frac{di_c}{dt} \quad (3)$$

Among them, $V_{g\_mil}$ is a gate Miller voltage, $L_{p\_A}$ is parasitic inductance of each bond wire which is between an emitter of an IGBT chip and a copper busbar in the IGBT module, n is a number of the bond wires, m is a number of broken or detached bond wires, $L_{s\_e}$ is equivalent parasitic inductance of the bond wire between the emitter of the IGBT and a cathode of the driving power source, $L_g$ is the sum parasitic inductance of the internal gate bond wire and driving resistor, and $i_c$ is a collector current.

Specifically, among them, $V_{g\_mil}$ and $$\frac{di_c}{dt}$$

are related to the bus voltage, the collector-emitter current and the temperature; in case of different bus voltages, collector-emitter currents and temperatures, the gate turning-on voltage overshoot is tested in a preliminary test, and then a relationship among $V_{g\_mil}$, $$\frac{di_c}{dt},$$

as well as the bus voltage, collector-emitter current, and temperature is given by multi-point fitting or by building a data table; here, $L_{p\_A}$, $L_{s\_e}$ and $L_g$ are solved by means of a physical calculation formula of inductance. In this way, the reference gate turning-on voltage overshoot thresholds $V_{g\_p}$ corresponding to different number of lift-off bond wires in operating states at different bus voltages, collector-emitter currents and temperatures are calculated by means of the formula 3.

Specifically, a converter bus voltage (through isolated differential sampling), an IGBT load current (measured through Rogowski coil), and IGBT module temperature (through NTC and a Δ-Σ conversion circuit) can be obtained by sampling. Then, based on these signals, the reference gate turning-on voltage overshoot threshold $V_{g\_p}$ may be set in real time with an analytical method or a look-up table method.

Generally, a change rate $$\frac{di_c}{dt}$$

of the turning-on collector current of IGBT is as high as more than 1000 A/us, therefore, as the number m of broken bond wires increases, there will be a voltage difference of several hundred millivolts or even several volts, generally. The calculated gate turning-on voltage overshoot $V_{g\_p}$ can be used as a theoretical value for the reference gate turning-on voltage overshoot threshold $V_{g\_p}$ in judging the bond wire state. Or, in the case of different broken bond wires of the IGBT module, the gate turning-on voltage overshoots are tested in a preliminary test with different voltages, currents, and temperatures, so as to determine the reference gate turning-on voltage overshoot thresholds $V_{g\_p}$ corresponding to different numbers of broken bond wires.

Phase 4 $[t_3$-$t_4]$: At this phase, the reverse recovery current $I_{rr}$ of the diode starts to decrease, and the collector-emitter voltage $v_{ce}$ continues to decrease. The gate voltage $V_g$ remains at $V_{g\_mil}$ unchanged.

Phase 5 $[t_4$-$t_5]$: The collector current $i_c$ has decreased to the load current $I_L$, and the collector-emitter voltage $v_{ce}$ continues to decrease. The gate voltage $V_g$ remains at $V_{g\_mil}$ unchanged.

Phase 6 $[t_5$-$t_6]$: After the IGBT is turned on, a saturation region is entered, and the collector current $i_c$ and the collector-emitter voltage $v_{ce}$ remain unchanged. The gate power source charges the gate input capacitance to the gate turning-on voltage $V_{g\_on}$ through the driving resistance $R_{g\_on}$.

Further, the bond wire state judging module includes a comparator and a processor; the comparator is configured to judge the magnitude relationship between the actual gate turning-on voltage overshoot and the reference gate turning-on voltage overshoot threshold $V_{g\_p}$ and send a judging result to the processor; and the processor performs an early warning on the bond wire state according to the judging result.

Further, a plurality of the comparators is provided, and the reference gate turning-on voltage overshoot thresholds $V_{g\_p}$ of each of the comparators corresponds to a corresponding number of broken bond wires. The IGBT-module condition monitoring equipment further includes latches, which are connected to outputs of the comparators and configured to perform comparison state locking on a gate turning-on voltage overshoot value, thereby guaranteeing the reversing stability at the comparison state.

Further, the IGBT-module condition monitoring equipment includes counters, wherein inputs of the counters are connected to outputs of the latches, and outputs of the counters are connected to the processor; and the counters are configured to record reversing numbers of different comparators for judging a probability of occurrence that a corresponding number of bond wires break.

Specifically, the processor includes a DSP or MCU, which may be configured to set the reference gate turning-on voltage overshoot threshold, receive a counting value of the counter, judge the bond wire state, perform early warning and the like.

Figure 6:
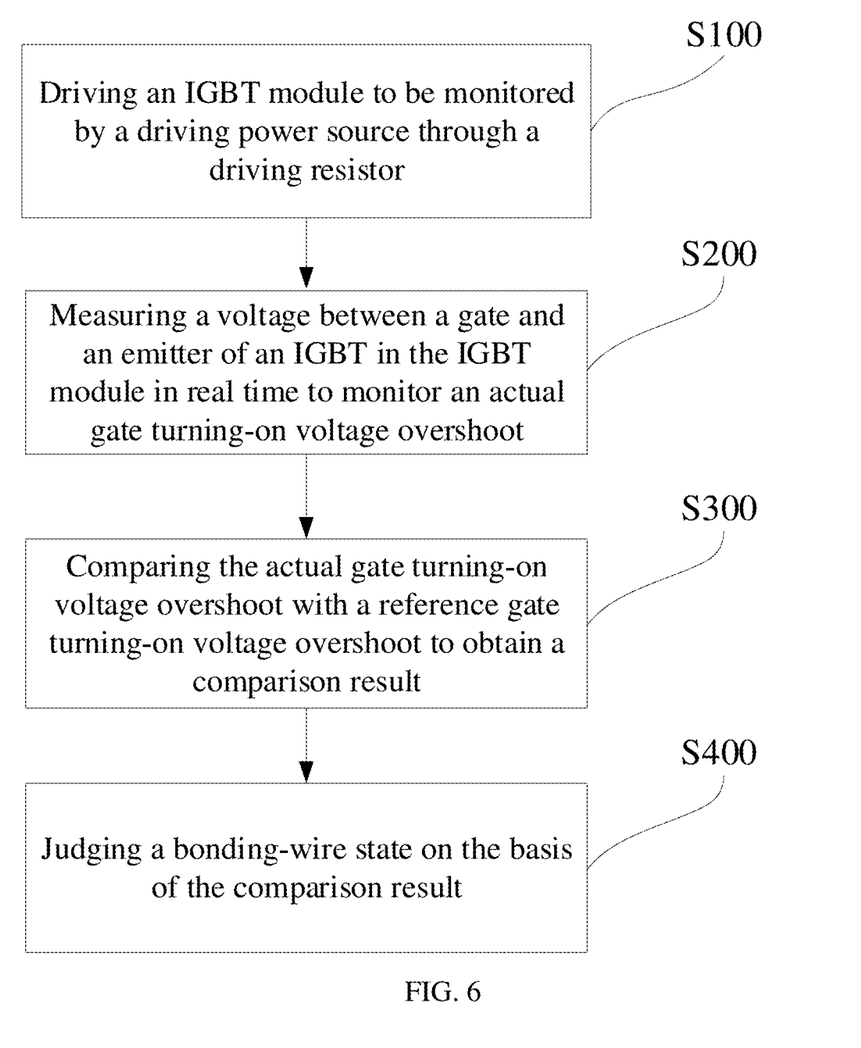
FIG. 6 is a schematic flowchart of a bonding-wire condition monitoring method according to the present invention.

According to the second aspect of the present invention, there is provided an IGBT-module condition monitoring method. As shown in FIG. 6, the method includes the following steps.

In S100, an IGBT module to be monitored is driven by a driving power source through a driving resistor.

In S200, a voltage between a gate and an emitter of an IGBT in the IGBT module is measured in real time to monitor an actual gate turning-on voltage overshoot.

In S300, the actual gate turning-on voltage overshoot is compared with a reference gate turning-on voltage overshoot threshold to obtain a comparison result.

In S400, a bond wire state is judged on the basis of the comparison result.

Further, in S300, the step that the actual gate turning-on voltage overshoot is compared with the reference gate turning-on voltage overshoot threshold to obtain the comparison result includes:

setting the reference gate turning-on voltage overshoot thresholds corresponding to the different numbers m of broken bonding-wires;

setting n comparators, wherein n is the number of bond wires, and the m-th comparator corresponds to the reference gate turning-on voltage overshoot threshold of the m broken bond wires, with m∈n; and judging a relationship between the actual gate turning-on voltage overshoot and the reference gate turning-on voltage overshoot threshold, and reversing output levels of the first to the m-th comparators if the actual gate turning-on voltage overshoot is greater than the m-th reference gate turning-on voltage overshoot threshold.

Further, the method further includes: setting n latches corresponding to the n comparators for latching the reversing of the corresponding comparators; and connecting a driving signal of the driving power source to reset terminals of the latches, so that output signal periods of the latches are consistent with IGBT periods.

Further, the step of judging the bond wire state according to the comparison result includes:

setting n counters corresponding to the n latches for recording the reversing number of the corresponding comparators; and judging that the bond wires with the number corresponding to the comparators break, when the reversing number of the corresponding comparator exceeds a threshold.

The equipment and method according to the present invention will be further explained below through a specific embodiment.

Figure 7:
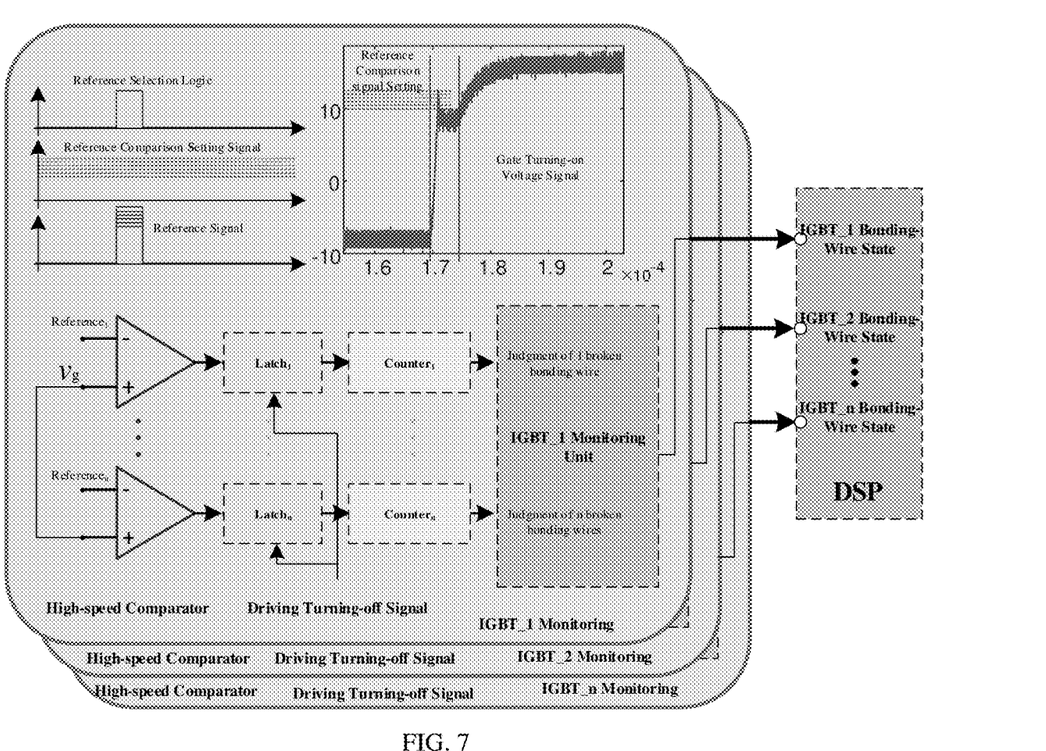
FIG. 7 is a circuit diagram showing a judging logic for bonding-wire condition monitoring according to a specific embodiment of the present invention.

FIG. 7 shows a judging logic circuit for bonding-wire condition monitoring. A driving turning-on voltage signal overshoot, i.e. a gate turning-on voltage overshoot signal, prior to a Miller platform is the actual object to be monitored. The gate turning-on voltage overshoot signal is compared with a reference signal. Among them, the reference signal is obtained by performing an AND operation on a reference selection logic and a reference comparison setting signal. A reference comparison setting signal is the aforementioned reference gate turning-on voltage overshoot threshold $V_{g\_p}$ which can be calculated by the formula 3, or obtained by testing in a preliminary test. The IGBTs with different number of broken bond wires correspond to different reference gate turning-on voltage overshoot thresholds $V_{g\_p}$. The reference selection logic is obtained by delaying the gate turning-on signal by one Miller platform, and the reference comparison setting signal is set on the basis of the gate turning-on voltage signal overshoot value in cases of different numbers of bond wires. As shown in FIG. 7, in an IGBT chip, a comparator, a latch connected to an output of the comparator, a counter connected to an output of the latch, and a corresponding IGBT monitoring unit are provided for each case of bond wire breakage. Multiple IGBT chips are connected in parallel to form an IGBT module. The IGBT monitoring unit for each IGBT chip aggregates and inputs monitoring results (judging results of m broken bond wires) to the processor (specifically, a DSP or MCU may be selected), by which the bond wire state of each IGBT chip is obtained. Specifically, the action of a high-speed comparator with a certain number indicates that the actual gate turning-on voltage overshoot of the IGBT exceeds a preset value (that is, the reference gate turning-on voltage overshoot threshold), and the bond wire is partially broken or detached (for instance, if the level of the high-speed comparator of No. 3 reverses to be low, 3 bond wires are indicated to be broken, the high-speed comparators with a number less than 3 may also undergo level reversing as low, and the high-speed comparators with a number greater than 3 may keep at high level). The outputs of the high-speed comparators are connected to the set inputs of the latches, so that the latches connected to the comparators that has undergone level reversing may undergo level reversing as high; and when a driving turning-off signal arrives, the latches are reset and the latch outputs become low. This process is repeated when the signal of the next cycle arrives. Therefore, the output signal period of the latches having the numbers corresponding to or below the number of broken bond wires is consistent with the switching period. Due to interferences and errors present in an actual circuit, certain reversing ineffectiveness will occur. Therefore, the signal is output to a counter, and then the probability of the reversing is judged on the basis of the value of the counter. The larger the counter value, the more likely the corresponding number of bond wires are broken. Furthermore, the state of the corresponding IGBT bond wires can be judged, and early warning can be made in time. By performing such judgment on each IGBT power bond wire, the purpose of monitoring the state of the entire IGBT module can be achieved. Among them, the voltage sampling circuit in the gate voltage overshoot monitoring module is an isolation circuit, thereby ensuring the electrical isolation for strong and weak electricity and the anti-interference capability of voltage signals. When the DSP or MCU judges the health degree of the emitter bond wires inside the IGBT module and obtains the number of broken bond wires, the IGBT module with significantly reduced health degree may be replaced, thereby reducing losses caused by the catastrophic failure of the IGBT.

In summary, the present invention provides an IGBT-module condition monitoring equipment and method. The IGBT-module condition monitoring equipment includes an IGBT module, a gate turning-on voltage overshoot monitoring module, a driving circuit, a bond wire state judging module and a signal acquisition module. The breakage condition of bond wires is obtained by comparing a monitored actual gate turning-on voltage overshoot with a preset reference gate turning-on voltage overshoot threshold. The present invention solves the problem encountered in monitoring the aging of IGBT bond wires in power electronic converters. By characterizing the bond wire detachment with the gate turning-on voltage overshoot, the slight aging of the detached bond wires can be monitored without disturbing the operation, which is high in resolution and free of invasiveness and enables real-time online monitoring at high sampling rate and low cost, showing great significance in the monitoring of the IGBT and the reliability evaluation of power electronic converters.

It should be understood that the specific embodiments above according to the present invention are merely for exemplarily illustrating or explaining the principle of the present invention, and are not intended to limit the present invention. Therefore, any modifications, equivalent substitutions, improvements and the like made without departing from the spirit and scope of the present invention shall be construed as falling within the protection scope of the present invention. In addition, the attached claims of the present invention are intended to encompass all the variations and amendments falling within the scope and boundaries or any equivalent forms of the attached claims.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An IGBT-module condition monitoring equipment, comprising: an IGBT module, a gate turning-on voltage overshoot monitoring module, a driving circuit, a bond wire state judging module, and a signal acquisition module, wherein the gate turning-on voltage overshoot monitoring module comprises a voltage sampling circuit for measuring a voltage between a gate and an emitter of an IGBT in the IGBT module to monitor an actual gate turning-on voltage overshoot;

the driving circuit comprises a driving power source and a driving resistor by which the driving power source is connected to the gate and the emitter of the IGBT module;

the bond wire state judging module is configured to judge a bond wire state by judging a magnitude relationship between the actual gate turning-on voltage overshoot and a reference gate turning-on voltage overshoot threshold $V_{g\_p}$; and the signal acquisition module is configured to transmit an acquired signal to the bond wire state judging module for determining the reference gate turning-on voltage overshoot threshold $V_{g\_p}$.

2. The equipment according to claim 1, wherein the bond wire state judging module comprises a comparator and a processor;

the comparator is configured to judge the magnitude relationship between the actual gate turning-on voltage overshoot and the reference gate turning-on voltage overshoot threshold $V_{g\_p}$, and send a judging result to the processor; and the processor is configured to perform an early warning on the bond wire state according to the judging result.

3. The equipment according to claim 2, wherein a plurality of the comparators are provided, and the reference gate turning-on voltage overshoot threshold $V_{g\_p}$ of each of the comparators corresponds to a corresponding number of broken bond wires; and the IGBT-module condition monitoring equipment further comprises latches, which are connected to outputs of the comparators and configured to perform comparison state locking on a gate turning-on voltage overshoot value.

4. The equipment according to claim 3, further comprising counters, wherein inputs of the counters are connected to outputs of the latches, and outputs of the counters are connected to the processor; and the counters are configured to record reversing numbers of different comparators for judging a probability of occurrence that a corresponding number of bond wires break.

5. The equipment according to claim 1, wherein in case of operating at the same bus voltage, collector-emitter current and temperature, the reference gate turning-on voltage overshoot threshold $V_{g\_p}$ is calculated by means of a formula as follows:

$$V_{g\_p} = V_{g\_mil} + \left(\frac{L_{p\_A}}{n-m} + L_{s\_e} + L_g\right)\frac{di_c}{dt} \quad (1)$$

wherein $V_{g\_mil}$ is a gate Miller voltage, $L_{p\_A}$ is parasitic inductance of each bond wire which is between an emitter of an IGBT chip and a copper busbar in the IGBT module, n is a number of the bond wires, m is a number of broken or detached bond wires, $L_{s\_e}$ is equivalent parasitic inductance of the bond wire between the emitter of the IGBT chip and a cathode of the driving power source, $L_g$ is the sum parasitic inductance of the internal gate bond wire and driving resistor, and $i_c$ is a collector current.

6. The equipment according to claim 5, wherein $V_{g\_mil}$ and $$\frac{di_c}{dt}$$

are related to a bus voltage, a collector-emitter current and temperature; in case of different bus voltages, collector-emitter currents and temperatures, the gate turning-on voltage overshoot is tested in a preliminary test, and then a relationship among $V_{g\_mil}$, $$\frac{di_c}{dt},$$

as well as the bus voltage, collector-emitter current, and temperature is given by multi-point fitting or by building a data table; and then with the formula 1 above, the reference gate turning-on voltage overshoot thresholds $V_{g\_p}$ corresponding to different number of broken bond wires in operating states at different bus voltages, collector-emitter currents and temperatures are calculated.

7. An IGBT-module condition monitoring method, comprising the following steps:
    driving an IGBT module to be monitored by a driving power source through a driving resistor;
    measuring a voltage between a gate and an emitter of an IGBT in the IGBT module in real time to monitor an actual gate turning-on voltage overshoot;
    comparing the actual gate turning-on voltage overshoot with a reference gate turning-on voltage overshoot threshold to obtain a comparison result; and
    judging a bond wire state on the basis of the comparison result.

8. The method according to claim 7, further comprising a step of setting the reference gate turning-on voltage overshoot threshold in advance, wherein the step comprises:
    testing the gate turning-on voltage overshoot in a preliminary test with different bus voltages, collector currents and temperatures;
    giving a relationship among $V_{g\_mil}$, $$\frac{di_c}{dt},$$

as well as the bus voltage, collector-emitter current, and temperature by multi-point fitting or by building a data table; and
    calculating the reference gate turning-on voltage overshoot thresholds $V_{g\_p}$ corresponding to different number of broken bond wires in operating states at different bus voltages, collector-emitter currents and temperatures, with a formula 1 below:

$$V_{g\_p} = V_{g\_mil} + \left(\frac{L_{p\_A}}{n-m} + L_{s\_e} + L_g\right)\frac{di_c}{dt} \quad (1)$$

wherein $V_{g\_mil}$ is a gate Miller voltage, $L_{p\_A}$ is parasitic inductance of each bond wire which is between an emitter of an IGBT chip and a copper busbar in the IGBT module, n is a number of the bond wires, m is a number of broken or detached bond wires, $L_{s\_e}$ is equivalent parasitic inductance of the bond wire between an emitter of an IGBT and a cathode of the driving power source, $L_g$ is the sum parasitic inductance of the internal gate bond wire and driving resistor, and $i_c$ is a collector current.

9. The method according to claim 7, wherein the step of comparing the actual gate turning-on voltage overshoot with the reference gate turning-on voltage overshoot threshold to obtain the comparison result comprises:
    setting the reference gate turning-on voltage overshoot thresholds corresponding to different numbers m of broken bonding-wires;
    setting n comparators, wherein n is the number of the bond wires, and the m-th comparator corresponds to the reference gate turning-on voltage overshoot threshold of the m broken bond wires, with m∈n; and
    judging a magnitude relationship between the actual gate turning-on voltage overshoot and the reference gate turning-on voltage overshoot threshold, and reversing output levels of the first to the m-th comparators if the actual gate turning-on voltage overshoot is greater than the m-th reference gate turning-on voltage overshoot threshold.

10. The method according to claim 9, further comprising: setting n latches corresponding to the n comparators for latching reversing of the corresponding comparators; and
    connecting a driving signal of the driving power source to reset terminals of the latches, so that output signal periods of the latches are consistent with IGBT periods, wherein
    the step of judging the bond wire state according to the comparison result comprises:
    setting n counters corresponding to the n latches for recording reversing number of the corresponding comparators; and
    when the reversing number of the corresponding comparator exceeds a threshold, judging that the bond wires with the number corresponding to the comparator break.

11. The equipment according to claim 2, wherein in case of operating at the same bus voltage, collector-emitter current and temperature, the reference gate turning-on voltage overshoot threshold $V_{g\_p}$ is calculated by means of a formula as follows:

$$V_{g\_p} = V_{g\_mil} + \left(\frac{L_{p\_A}}{n-m} + L_{s\_e} + L_g\right)\frac{di_c}{dt} \quad (1)$$

wherein $V_{g\_mil}$ is a gate Miller voltage, $L_{p\_A}$ is parasitic inductance of each bond wire which is between an emitter of an IGBT chip and a copper busbar in the IGBT module, n is a number of the bond wires, m is a number of broken or detached bond wires, $L_{s\_e}$ is equivalent parasitic inductance of the bond wire between the emitter of the IGBT chip and a cathode of the driving power source, $L_g$ is the sum parasitic inductance of the internal gate bond wire and driving resistor, and $i_c$ is a collector current.

12. The equipment according to claim 3, wherein in case of operating at the same bus voltage, collector-emitter current and temperature, the reference gate turning-on voltage overshoot threshold $V_{g\_p}$ is calculated by means of a formula as follows:

$$V_{g\_p} = V_{g\_mil} + \left(\frac{L_{p\_A}}{n-m} + L_{s\_e} + L_g\right)\frac{di_c}{dt} \quad (1)$$

wherein $V_{g\_mil}$ is a gate Miller voltage, $L_{p\_A}$ is parasitic inductance of each bond wire which is between an emitter of an IGBT chip and a copper busbar in the IGBT module, n is a number of the bond wires, m is a number of broken or detached bond wires, $L_{s\_e}$ is equivalent parasitic inductance of the bond wire between the emitter of the IGBT chip and a cathode of the driving power source, $L_g$ is the sum parasitic inductance of the internal gate bond wire and driving resistor, and $i_c$ is a collector current.

13. The equipment according to claim 4, wherein in case of operating at the same bus voltage, collector-emitter current and temperature, the reference gate turning-on voltage overshoot threshold $V_{g\_p}$ is calculated by means of a formula as follows:

$$V_{g\_p} = V_{g\_mil} + \left(\frac{L_{p\_A}}{n-m} + L_{s\_e} + L_g\right)\frac{di_c}{dt} \quad (1)$$

wherein $V_{g\_mil}$ is a gate Miller voltage, $L_{p\_A}$ is parasitic inductance of each bond wire which is between an emitter of an IGBT chip and a copper busbar in the IGBT module, n is a number of the bond wires, m is a number of broken or detached bond wires, $L_{s\_e}$ is equivalent parasitic inductance of the bond wire between the emitter of the IGBT chip and a cathode of the driving power source, $L_g$ is the sum parasitic inductance of the internal gate bond wire and driving resistor, and $i_c$ is a collector current.

14. The method according to claim 8, wherein the step of comparing the actual gate turning-on voltage overshoot with the reference gate turning-on voltage overshoot threshold to obtain the comparison result comprises:

setting the reference gate turning-on voltage overshoot thresholds corresponding to different numbers m of broken bonding-wires;

setting n comparators, wherein n is the number of the bond wires, and the m-th comparator corresponds to the reference gate turning-on voltage overshoot threshold of the m broken bond wires, with m∈n; and judging a magnitude relationship between the actual gate turning-on voltage overshoot and the reference gate turning-on voltage overshoot threshold, and reversing output levels of the first to the m-th comparators if the actual gate turning-on voltage overshoot is greater than the m-th reference gate turning-on voltage overshoot threshold.

* * * * *